US009811267B1

(12) United States Patent
Yang et al.

(10) Patent No.: US 9,811,267 B1
(45) Date of Patent: Nov. 7, 2017

(54) NON-VOLATILE MEMORY WITH INTELLIGENT TEMPERATURE SENSING AND LOCAL THROTTLING

(71) Applicant: SANDISK TECHNOLOGIES LLC, Plano, TX (US)

(72) Inventors: Nian Niles Yang, Mountain View, CA (US); Grishma Shah, Milpitas, CA (US); Phil Reusswig, Mountain View, CA (US); Dmitry Vaysman, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/294,313

(22) Filed: Oct. 14, 2016

(51) Int. Cl.
*G06F 3/06* (2006.01)

(52) U.S. Cl.
CPC ............ *G06F 3/061* (2013.01); *G06F 3/0655* (2013.01); *G06F 3/0688* (2013.01)

(58) Field of Classification Search
CPC ......... G11C 7/04; G06F 3/061; G06F 3/0655; G06F 3/0688; G06F 3/0625; G06F 1/324; G06F 1/32; H01L 23/34
See application file for complete search history.

(56) References Cited

U.S. PATENT DOCUMENTS

| 7,436,724 | B2 | 10/2008 | Nandi |
| 7,596,714 | B2 | 9/2009 | Rothman |
| 7,755,946 | B2 | 7/2010 | Dunga |
| 7,797,506 | B2 | 9/2010 | Rangarajan |
| 8,213,255 | B2 | 7/2012 | Hemink |
| 8,472,274 | B2 | 6/2013 | Fai |
| 9,006,000 | B2 | 4/2015 | Hanan |
| 9,202,579 | B2 | 12/2015 | Hsiung |
| 9,244,519 | B1 | 1/2016 | Ellis |
| 9,355,024 | B2 | 5/2016 | Nguyen |
| 9,437,318 | B2 | 9/2016 | Dong |
| 2008/0163226 | A1* | 7/2008 | Radhakrisnan ....... G06F 1/3203 718/102 |
| 2011/0219203 | A1 | 9/2011 | Nurminen |
| 2012/0224425 | A1* | 9/2012 | Fai ..................... G11C 11/5642 365/185.09 |

(Continued)

OTHER PUBLICATIONS

Ray, et al., "Temperature Dependent Sensing Scheme," U.S. Appl. No. 62/052,473, filed Sep. 19, 2014.

*Primary Examiner* — Richard Elms
*Assistant Examiner* — Ajay Ojha
(74) *Attorney, Agent, or Firm* — Vierra Magen Marcus LLP

(57) ABSTRACT

A non-volatile storage apparatus comprises a controller, one or more memory packages, a system temperature sensor, and one or more memory temperature sensors. The system temperature sensor is located at or on the controller. Each of the one or more memory temperature sensors are positioned at one of the one or more memory packages. The controller monitors system temperature using the system temperature sensor. If the system temperature is above a first threshold, then temperature is sensed at the memory packages using the one or more memory temperature sensors. Individual memory packages have their performance throttled if their temperature exceeds a second threshold.

20 Claims, 17 Drawing Sheets

(56) References Cited

U.S. PATENT DOCUMENTS

| | | | |
|---|---|---|---|
| 2014/0101371 A1* | 4/2014 | Nguyen | G06F 3/0616 711/103 |
| 2015/0301744 A1 | 10/2015 | Kim | |
| 2015/0373876 A1* | 12/2015 | Berke | G05B 15/02 700/282 |
| 2016/0086675 A1 | 3/2016 | Ray | |
| 2016/0162219 A1* | 6/2016 | Erez | G06F 3/0653 711/103 |

* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

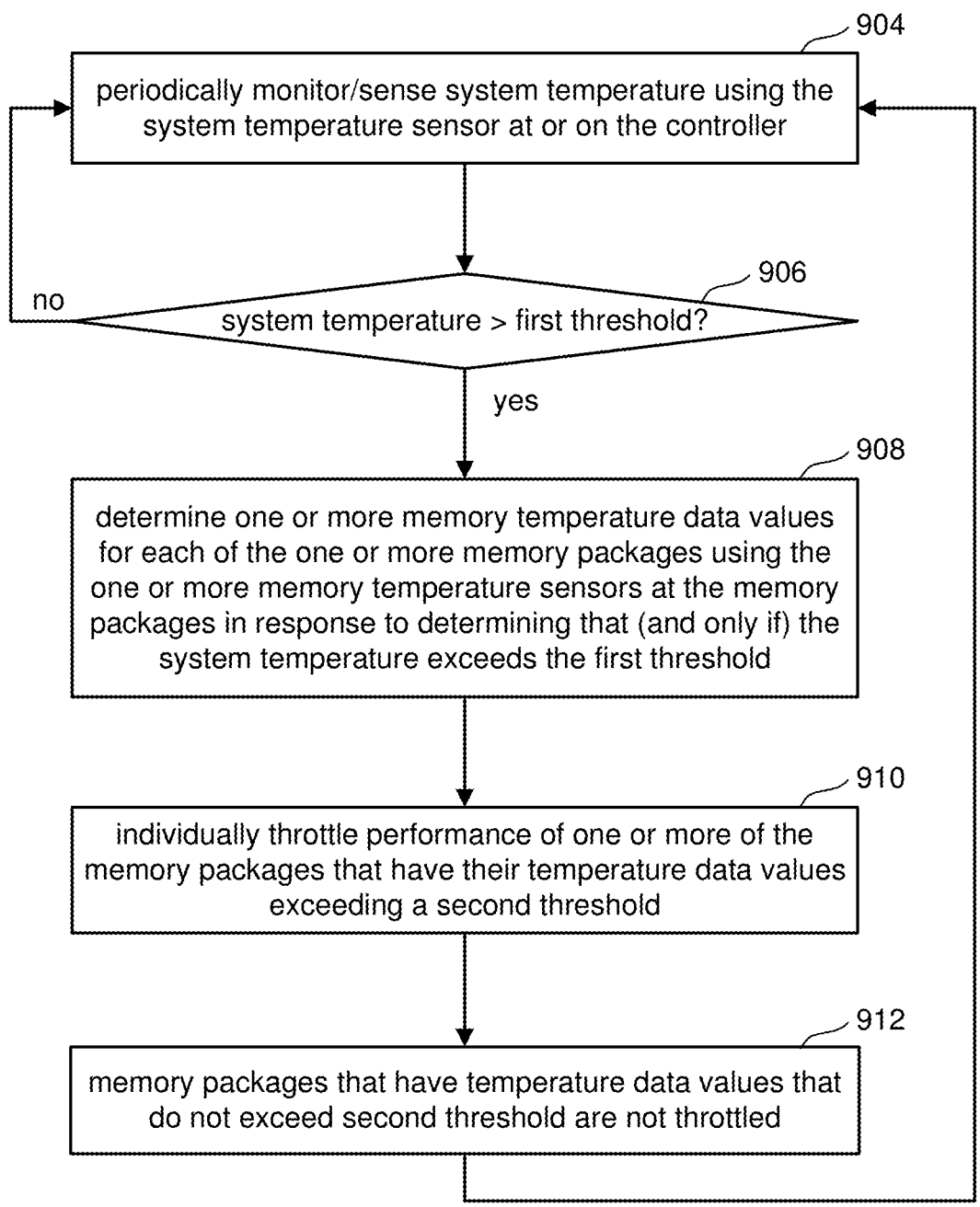

NON-VOLATILE MEMORY WITH INTELLIGENT TEMPERATURE SENSING AND LOCAL THROTTLING

BACKGROUND

Semiconductor memory is widely used in various electronic devices such as cellular telephones, digital cameras, personal digital assistants, medical electronics, mobile computing devices, servers and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Memory systems can be used to store data provided by a host device or other entity. The data can then be read back and provided in response to read requests. It is important that data stored in a memory system is not lost. Additionally, users want high performance when using memory system.

BRIEF DESCRIPTION OF THE DRAWINGS

Like-numbered elements refer to common components in the different figures.

FIG. 9 is a flow chart describing one embodiment of a process for intelligent temperature sensing and local throttling.

DETAILED DESCRIPTION

Some semiconductor memory systems include a controller connected to one or more memory dies. It has been observed that when such semiconductor memory systems get too hot, the memory may experience problems. For example, latent defects may manifest themselves or the memory may experience data retention issues. Therefore, some systems will monitor temperature at the controller and, if the controller gets too hot, the controller will throttle performance of all of the memory dies.

Throttling performance of a memory die is a function designed to lower performance of the memory dies in order to lower temperature of the memory die. Examples of throttling performance of a memory die include slowing down a clock for the memory die (ie reduce the clock rate) and/or reducing the number of instructions per unit of time sent to and acted on by the memory die.

However, throttling the memory dies based on the temperature of the controller is not the most accurate strategy. For example, the controller is running at more times than most memory die, so the controller is likely to be hotter than any memory dies. Additionally, the controller and the memory dies may be on different sides of a memory system (e.g., a solid state drive—SSD); therefore, the components of the host next to the controller may be different than the components next to a memory die. For example, consider when a SSD is located in a laptop computer. On one side of the SSD (where the controller is) might be next to the CPU for the laptop (which runs hot) and on another side of the SSD (where a memory die is) is the RAM for the laptop (which runs cooler than the CPU); therefore, the memory die might not be as hot as the controller. Additionally, there may be circumstances when some memory dies are hot while others are not hot.

To more accurately monitor and manage temperature, it is proposed to measure temperature at the controller and at the memory die. However, measuring temperature at the many memory die as often as the measurements at the controller can waste power and time. Therefore, the solution proposed herein periodically measures temperature at the controller (or other type of control circuit). When the temperature at the controller crosses a first threshold, then the system will perform temperature measurements at the memory dies. With this technique, memory dies can be individually throttled based on their local temperature. In systems that aggregate memory dies into packages, the temperature can be measured for the package or the memory dies in the packages, and the throttling can be at the package level or the memory die level. In this manner, even if the controller is hot, memory dies or packages that are not hot are not throttled and can maintain full performance.

Figure 1:
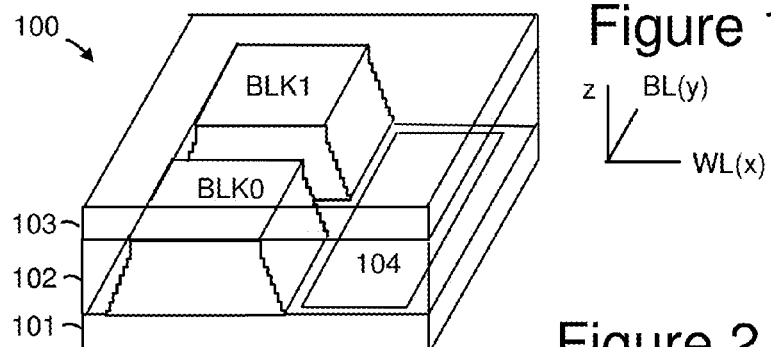
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
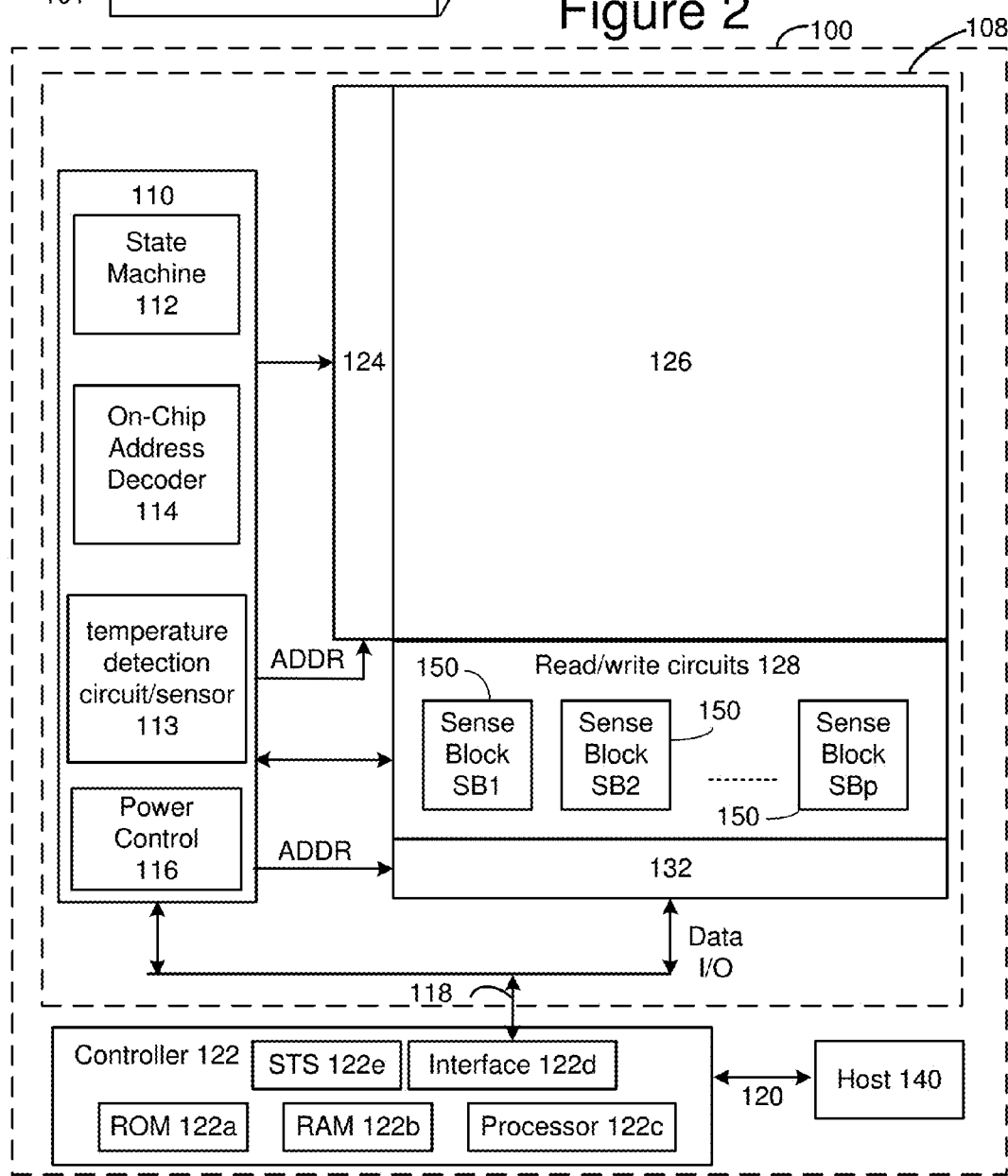
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations. Temperature detection circuit 113 (which is an example of a memory temperature sensor on memory die 108) is configured to detect temperature at the memory die 108, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and controller 122 can be considered one or more control circuits that performs the functions described herein.

The (on-chip or off-chip) controller 122 (which in one embodiment is an electrical circuit) may comprise one or more processors 122c, ROM 122a, RAM 122b, Memory Interface 122d and a system temperature sensor 122e, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d. In one embodiment, processor 122c can access code from ROM 122a or RAM 122b to detect read disturb in open blocks and take action to mitigate the read disturb, including determining that a particular block of non-volatile memory cells is an open block and has been subjected to a minimum number of read operations; reading memory cells connected to an open word line of the particular block and identifying unerased bits; and copying data for the particular block to a new block if there are more than a minimum number of unerased bits for the open word line. System temperature sensor 122e is configured to detect temperature at the controller 122, and can be any suitable temperature detection circuit known in the art. As can be seen from FIG. 2, the system temperature sensor 122e is away and at a distance from each of the one or more memory dies 108.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
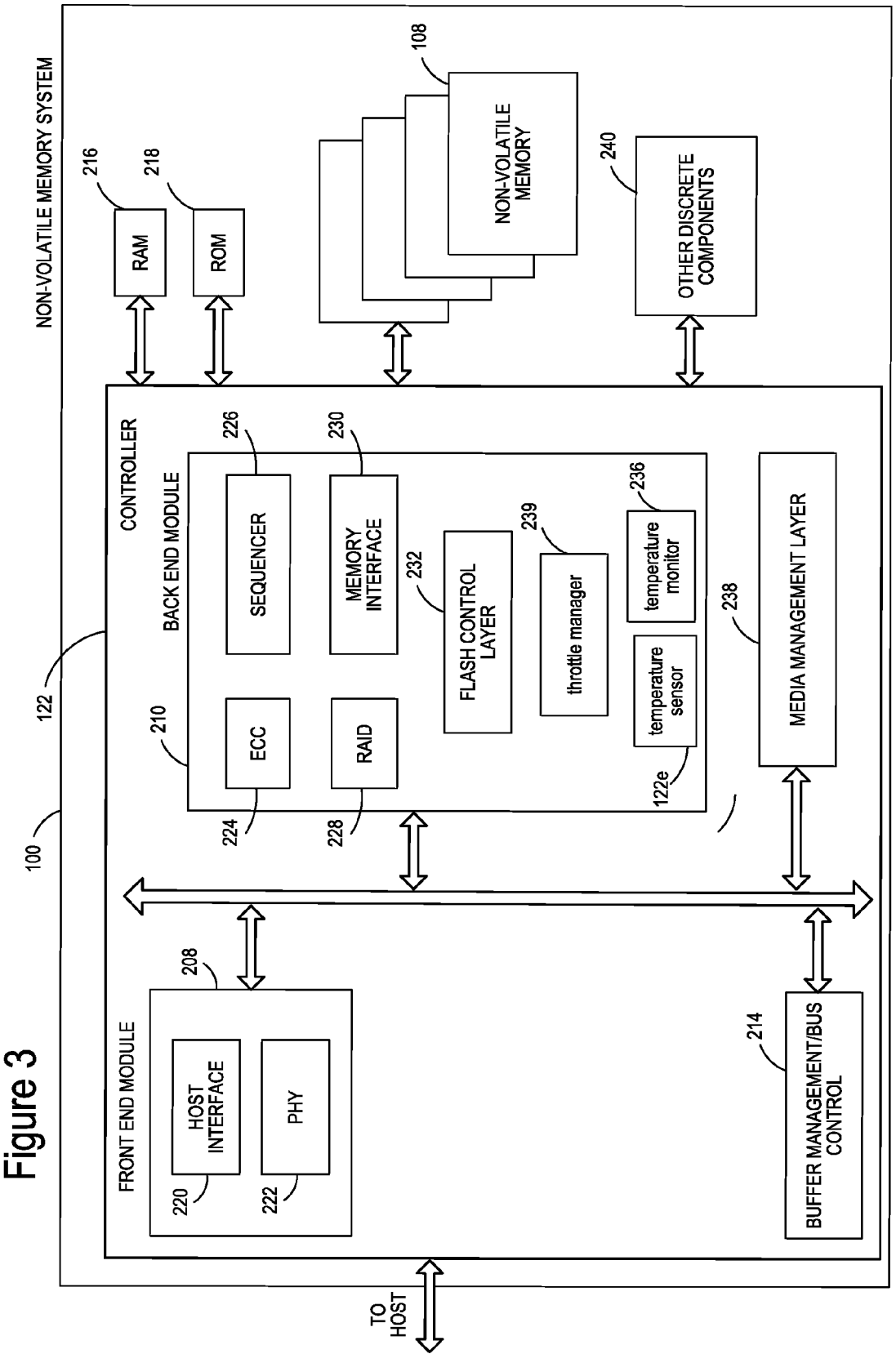
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state drive (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a temperature monitor 236, throttle manager 239 and system temperature sensor 122e. Temperature monitor 236 monitors the temperature at system temperature sensor 122e and determines whether the monitored temperature at system temperature sensor 122e exceeds a first threshold (e.g., 100 degrees Fahrenheit). Temperature monitor 236 also receives temperature data from the temperature sensors 113 of the multiple memory die 108 and determines whether the memory dies 108 need to be throttled. For example, temperature monitor 236 may determine whether the temperature at the memory dies is over a second threshold. In some embodiments, the second threshold is equal to the first threshold. In other embodiments, the second threshold is different than the first threshold (e.g., 10 degrees warmer). In response to the analysis of temperature monitor 236, throttle manager 239 throttles performance of one or more memory dies (or package(s)) that is co-located with at least one of the memory temperature sensors that has a sensed temperature greater than the second threshold.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
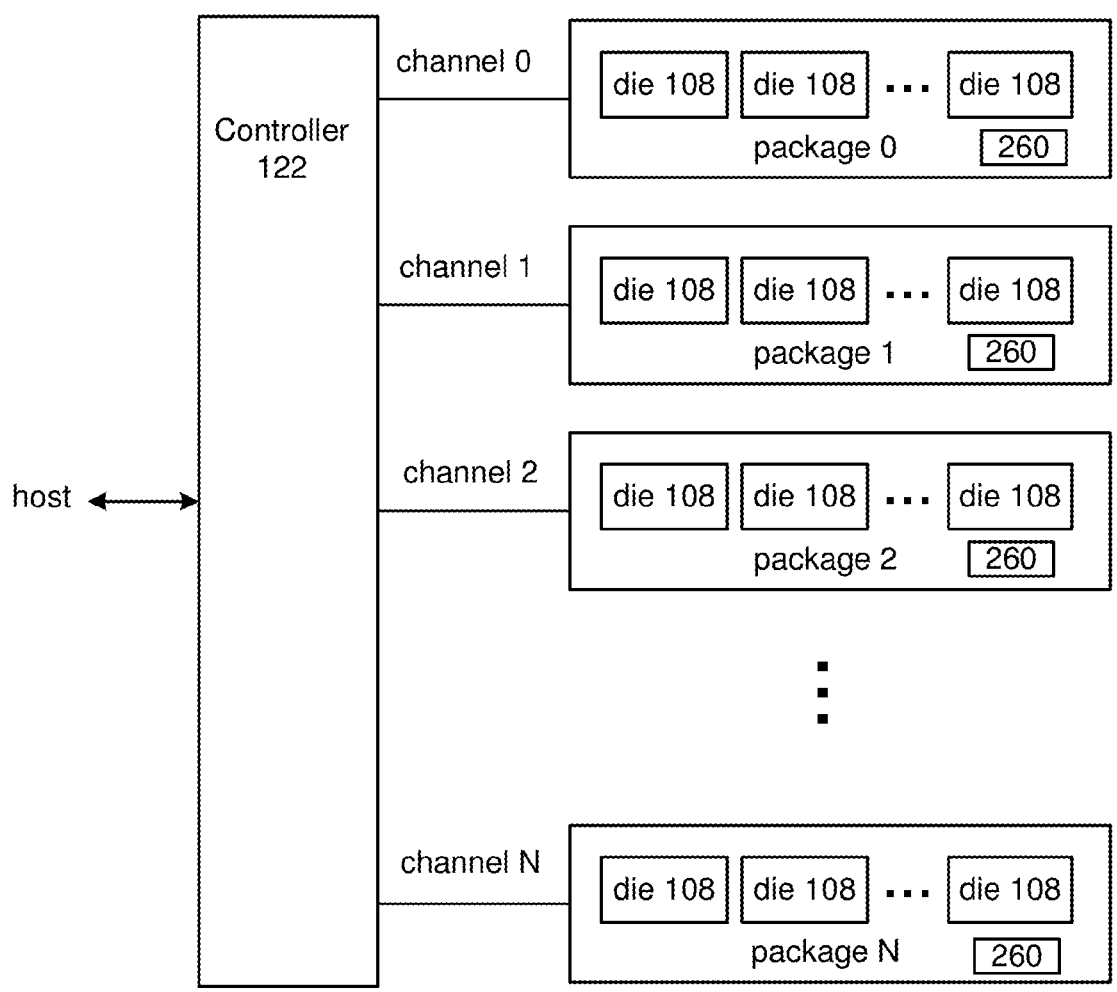
FIG. 3A is a block diagram depicting one embodiment of a memory system.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 3A shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

FIG. 3A shows that each memory package (package 0-package N) includes a temperature sensor 260, which can be any suitable temperature sensor known in the art. Temperature sensor 260 is in the package but not on any of the memory dies (off the memory dies). The temperature sensor 260 on the memory packages can be in addition to or instead of the temperature sensors 113 on the memory dies 108. Thus, some embodiments include one or more memory temperature sensors (connected to the one or more control circuits) positioned only on the memory packages (e.g., temperature sensor 260), some embodiments include one or more memory temperature sensors (connected to the one or more control circuits) positioned only on the memory dies 108 (e.g., temperature sensors 113) and some embodiments include one or more memory temperature sensors (connected to the one or more control circuits) positioned on the memory dies 108 (e.g., temperature sensors 113) and positioned on the memory packages (e.g., temperature sensor 260). Additionally, some embodiments include temperature sensors in the memory system that are adjacent to but not in a memory package or memory die.

In some embodiments, the distances between individual memory temperature sensors and the controller are different, meaning that different memory sensors are different distances from the controller which may cause them to experience different temperatures. This is because, in some embodiments, different memory packages are different distances from the controller.

Note that the temperature sensor 260 and temperature sensor 113 are contrasted with temperature sensor 122e. For example, temperature sensor 260 and temperature sensor 113 are located at one or more memory packages while temperature sensor 122e is positioned off of and at a distance away from the one or more memory packages/dies of the memory system. Additionally, temperature sensor 260 and temperature sensor 113 sense temperature for the one or more memory packages/dies while temperature sensor 122e senses temperature for the system (e.g., the controller).

In one embodiment, the memory system includes one or more memory temperature sensors such that each of the one or more memory temperature sensors are positioned at one of the one or more memory packages. This means that each of the memory temperature sensors are in a location that can sense temperature one or more of the packages (where a package can be one or multiple memory dies); this also allows for some memory packages to have multiple memory temperature sensors that can sense temperature at the package. For example, a memory package that include temperature sensor 260 and temperature sensors 113 on the memory dies has multiple memory temperature sensors that can sense temperature at the package.

Controller 122 receives a request from the host to program host data (data received from the host) into the memory system. In some embodiments, Controller 122 will arrange the host data to be programmed into units of data. For example, Controller 122 can arrange the host data into pages, word line units, blocks, super blocks, or other units. Super blocks are units of data that are programmed and read together, but span across multiple memory die 108. In one embodiment, a super block includes two blocks from one die in each package. The two blocks from one die include one block each from two planes. However, other arrangements can also be used.

Figure 4:
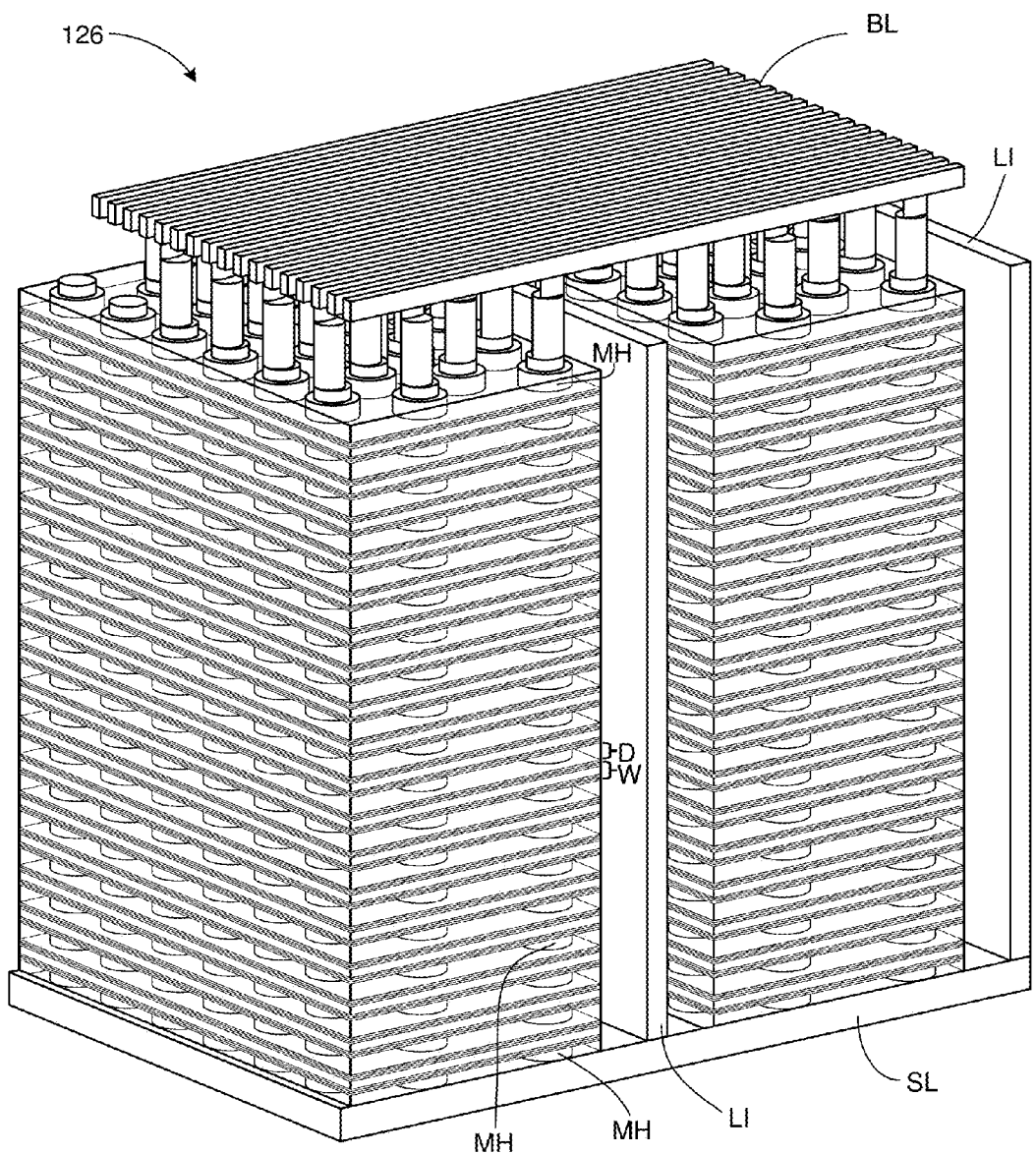
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
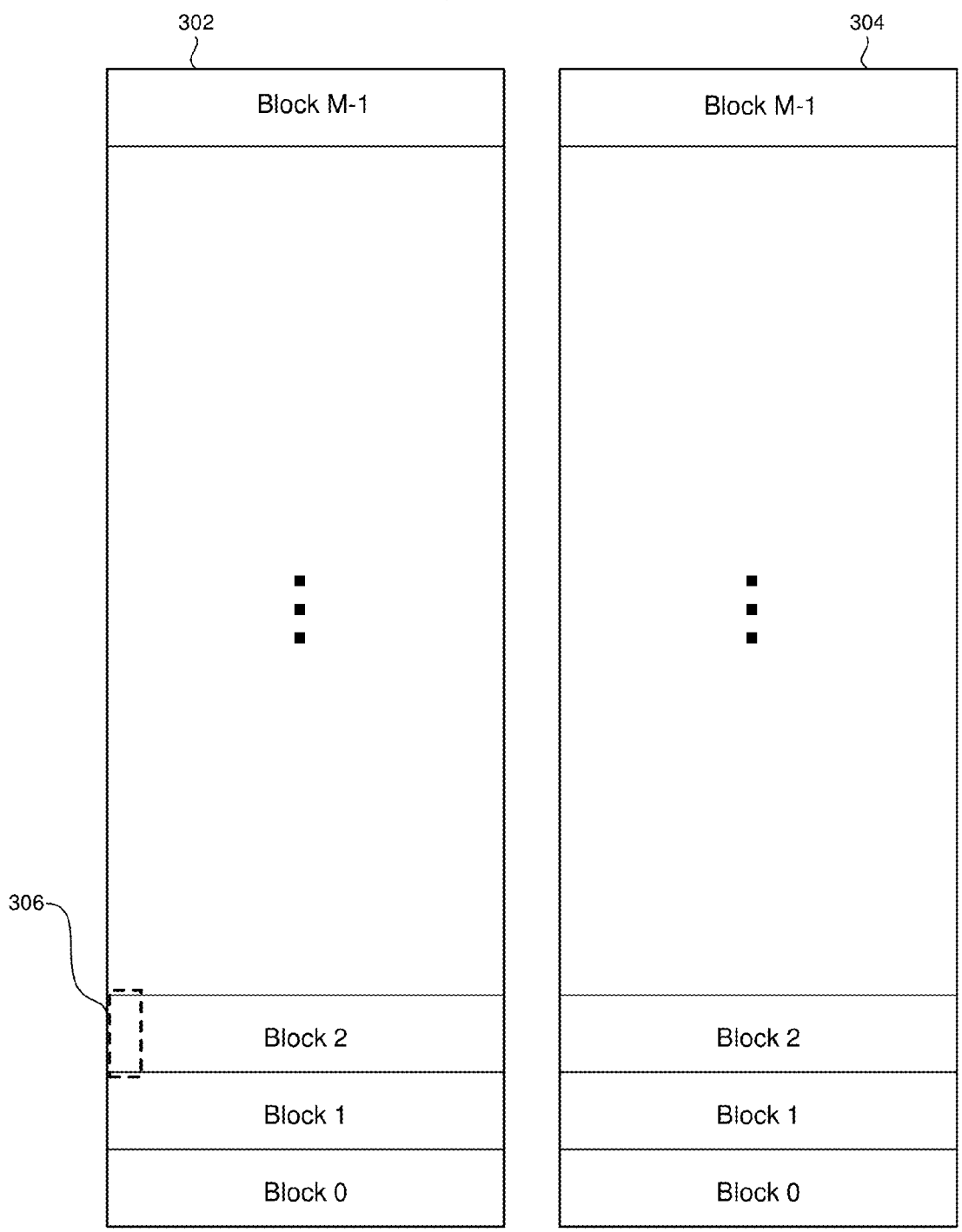
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
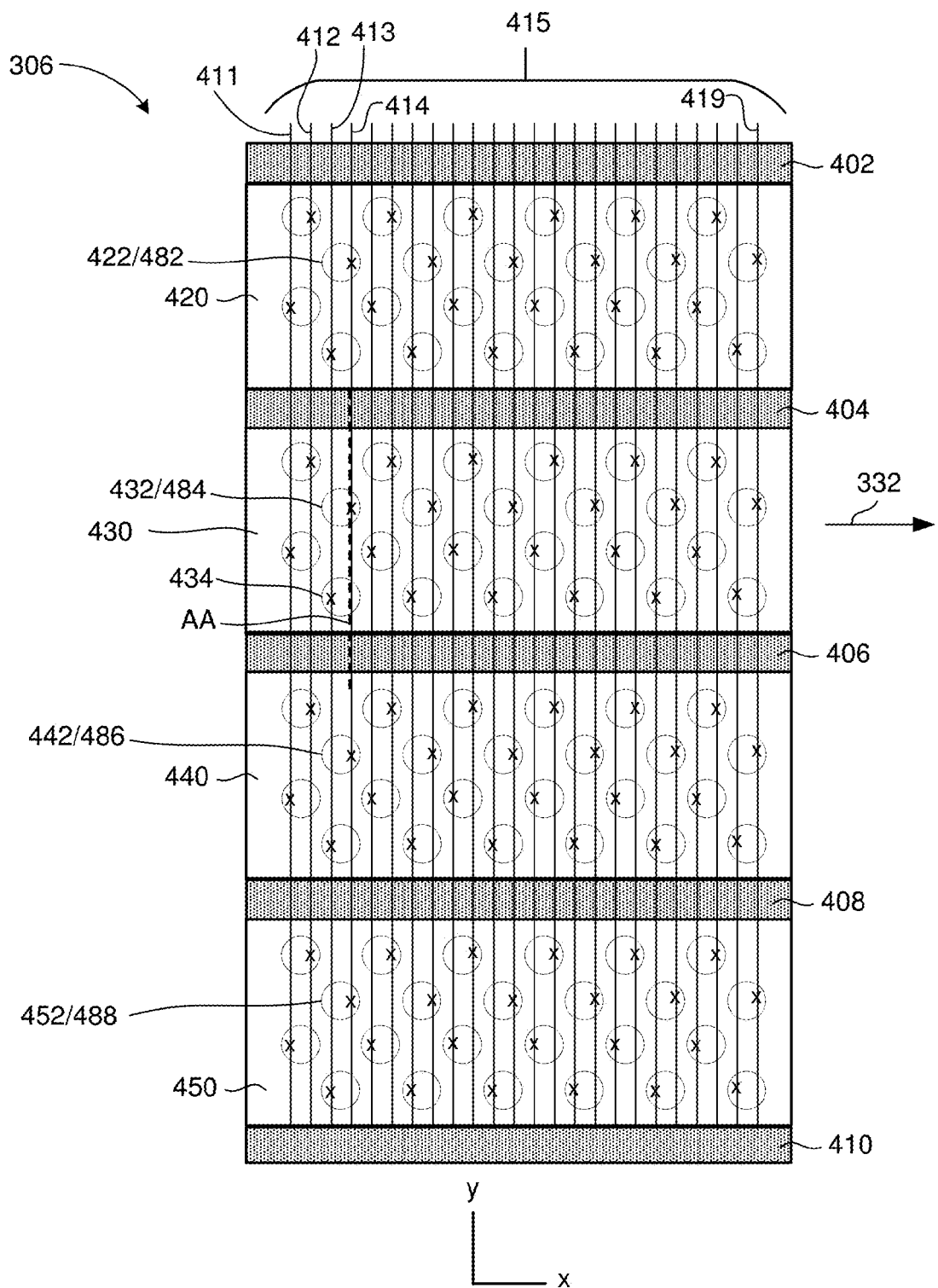
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns.

Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
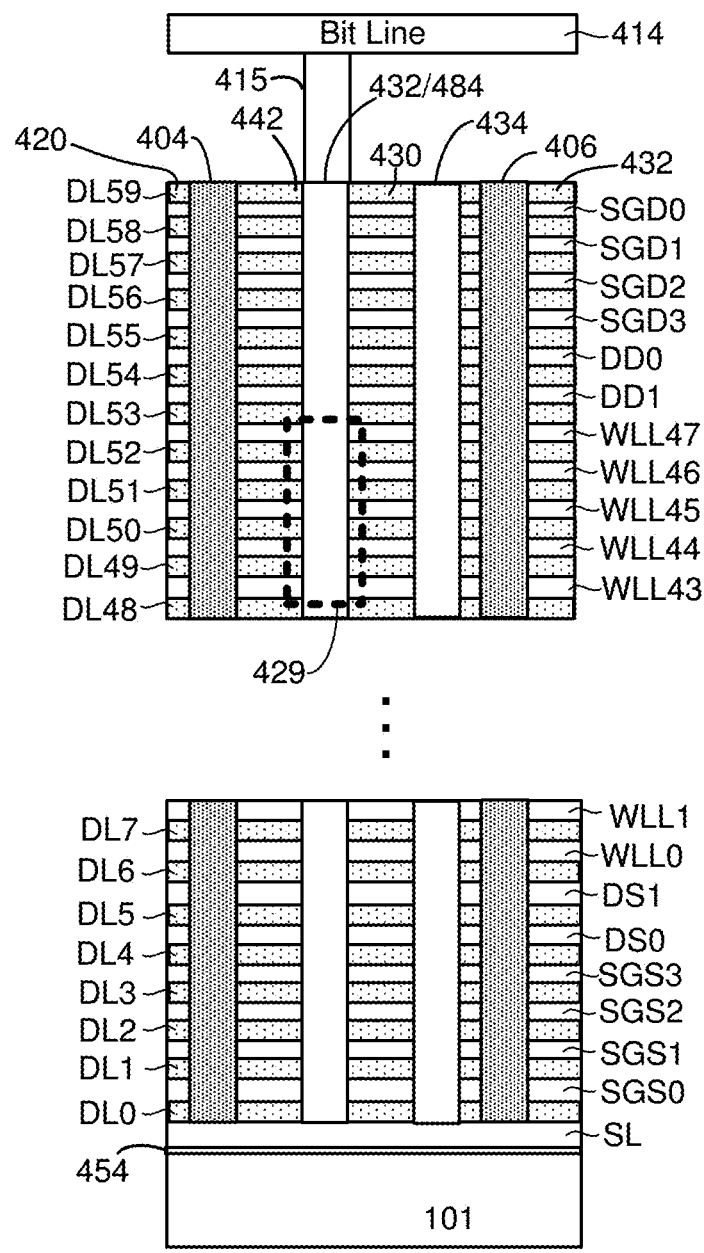
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO₂. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
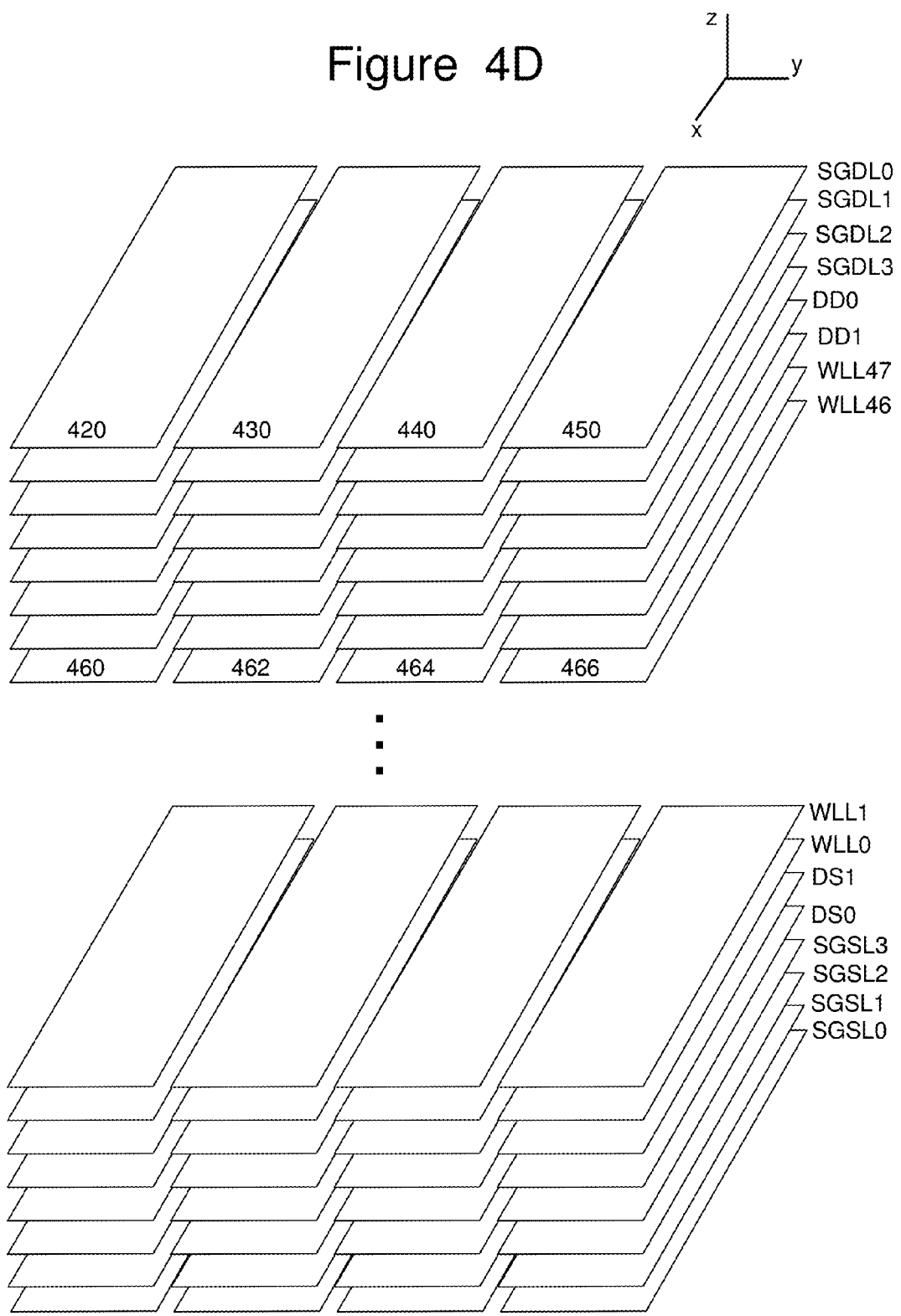
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
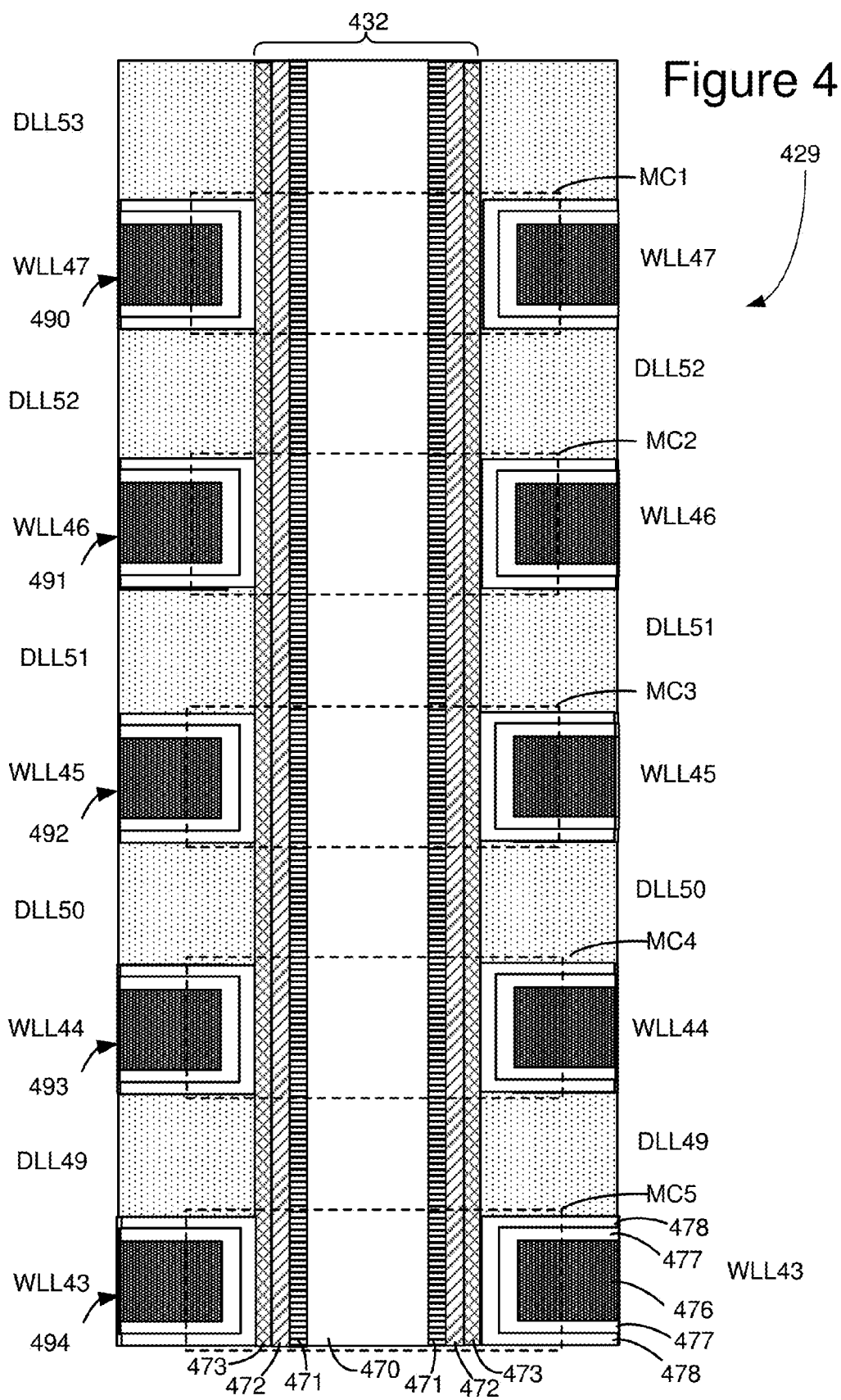
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO₂. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
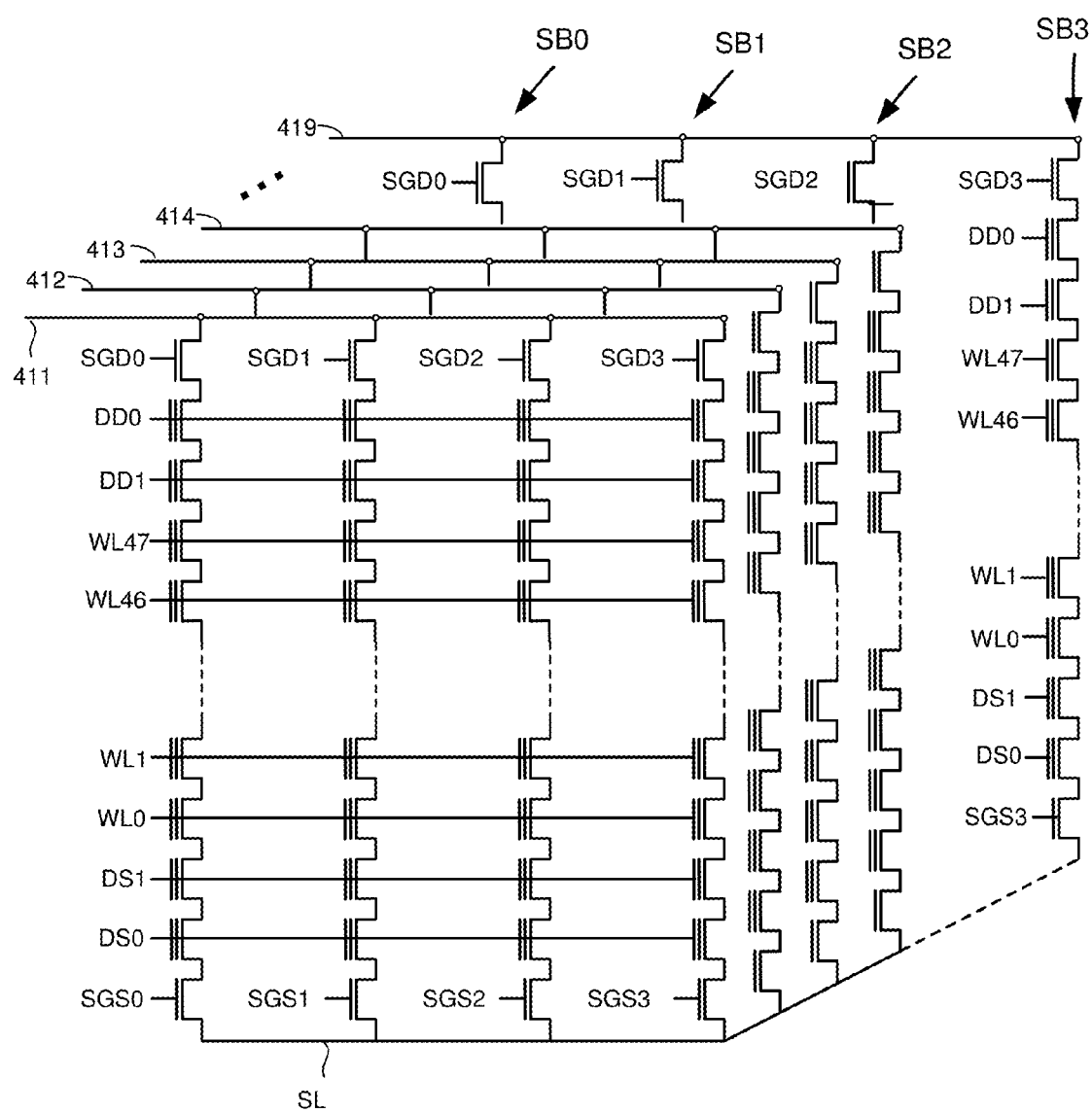
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 6:
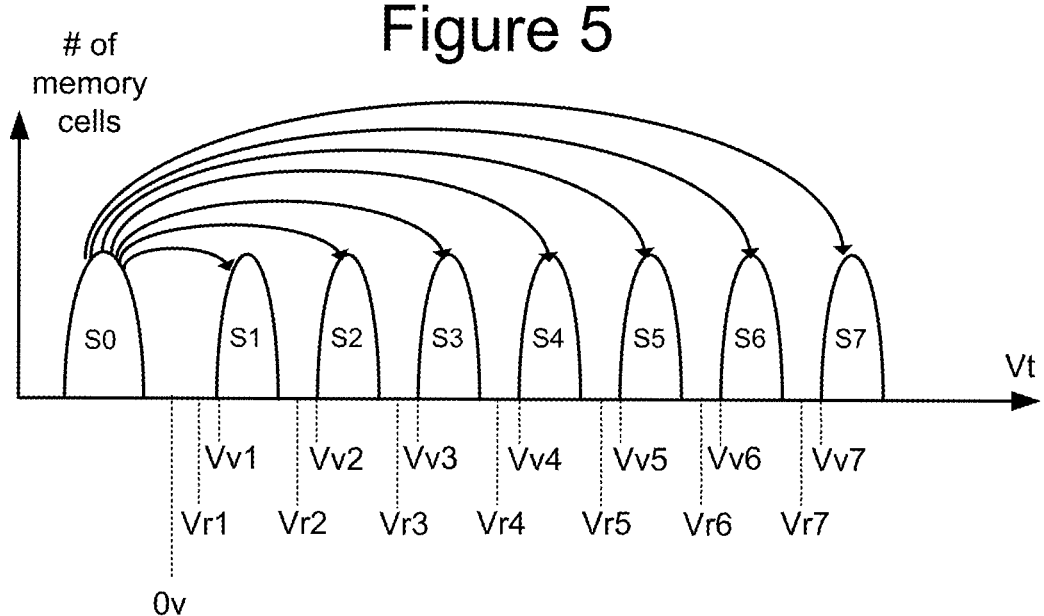
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming) In some embodiments, data states S1-S7 can overlap, with controller 122 relying on ECC to identify the correct data being stored.

FIG. 6 is a table describing one example of an assignment of data values to data states. In the table of FIG. 6, S0-111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

Figure 7A:
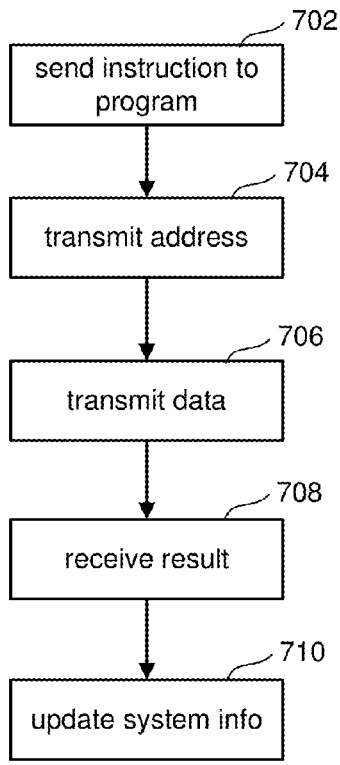
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
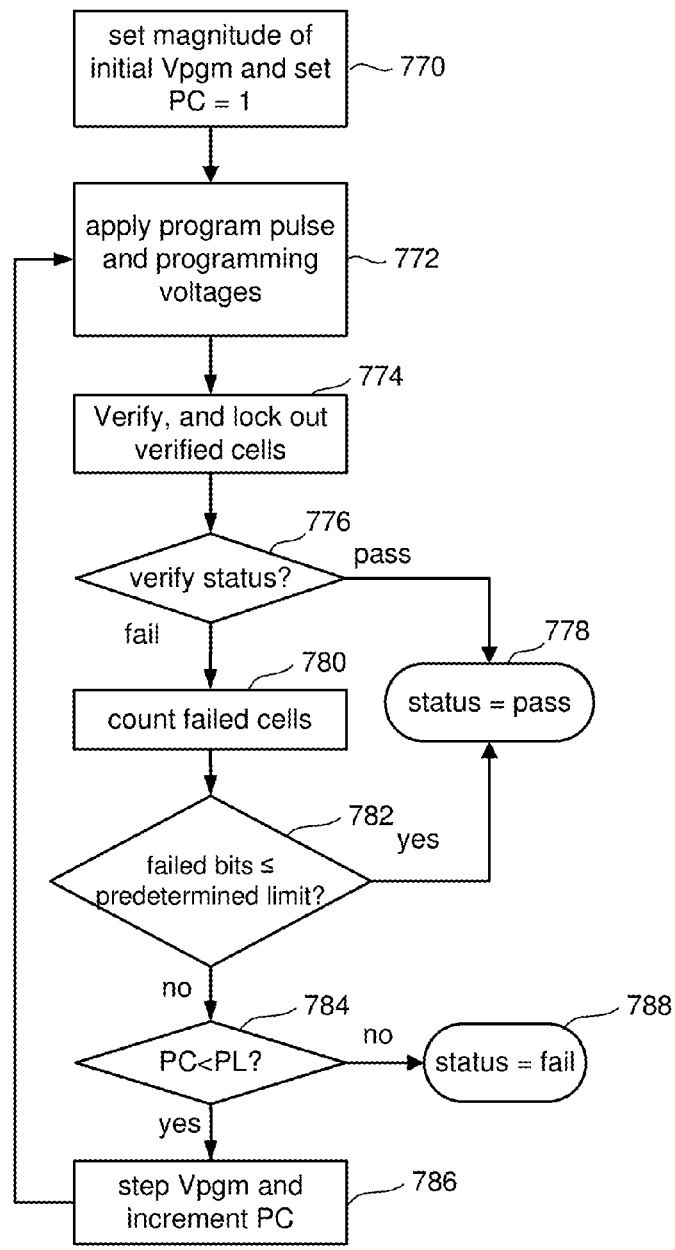
FIG. 7B is a flow chart describing one embodiment of a process for programming.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778.

If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8A:
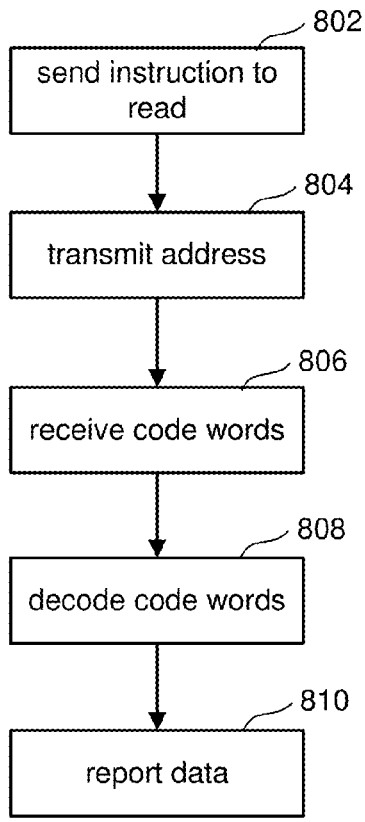
FIG. 8A is a flow chart describing one embodiment of a process for reading.

FIG. 8A is a flowchart describing one embodiment of a process for reading that is performed by controller 122. In step 802, controller 122 sends instructions to one or more memory die 108 to read data. In step 804, controller 122 sends one or more addresses to one or more memory die 108. In step 806, controller 122 receives a set of code words from the one or more memory die 108. In step 808, controller 122 decodes the received code words using ECC engine 224. In step 808, controller 122 reports the decoded data to the host.

Figure 8B:
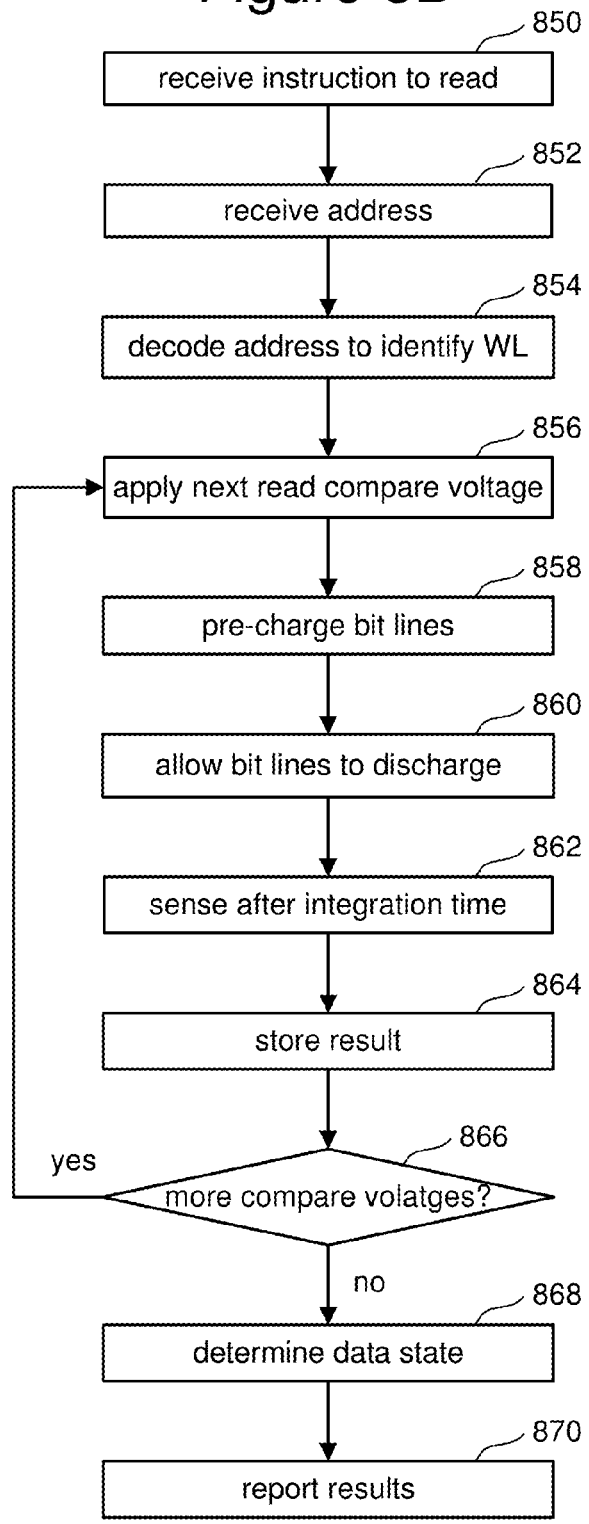
FIG. 8B is a flow chart describing one embodiment of a process for reading.

FIG. 8B is a flowchart describing one embodiment of a process for reading that is performed by a memory die 108 in response the controller 122 performing the process of FIG. 8A. In step 850, memory die 108 receives one or more instructions to read from controller 122. In step 852, memory die 108 receives one or more addresses from controller 122. In step 854, memory die 108 decodes the address received in step 852 in order to identify the selected word line. The read process will read data from memory cells connected to the selected word line. As this is a read process, the system will apply the various read compare voltages Vr1, Vr2, Vr3, Vr4, Vr5, Vr6, and Vr7 (see FIG. 5). In step 856, the next read compare voltages is applied to the selected word line. The first time step 856 is performed, Vr1 is applied to the selected word line. In step 858, all of the bit lines are pre-charged. In step 860, each bit line is allowed to discharge using a sense amplifier. After a predetermined time period, referred to as the "integration time," the bit line's discharge is sampled (step 862). For example, if the bit lines are used to discharge capacitors in the sense amplifiers, step 862 includes sensing a voltage on the capacitor. Step 862 comprises determining whether the memory cells conducted in response to the read compare voltage applied to the selected word line. In step 864, the sense blocks record the results of whether the connected memory cells conducted in response to the read compare voltage applied to the selected word line. If there are more read compare voltages that need to be tested (step 866), then the process loops back to step 856 and apply the next read compare voltage. In the embodiment that uses seven read compare voltages (e.g., Vr1, Vr2, Vr3, Vr4, Vr5, Vr6, and Vr7), the loop of steps 856-864 is performed seven times. In other embodiments, more or less than seven read compare voltages are used. If all read compare voltages have been tested (step 866), then the process continues at step 868. In step 868, the system determines the data state that each memory cell is in based on the results of the seven iterations of the loop of steps 856-864. In step 870, the results of the read process (e.g., the code words read from the memory cells) are reported back to Controller 122. The reporting in step 870 is received by Controller 122 in step 806 of FIG. 8A.

As discussed above, it is proposed to periodically measure temperature at the controller (or other type of control circuit). When the temperature at the controller crosses a first threshold, then the system will perform temperature measurements at the memory dies. With this technique, memory dies can be individually throttled based on their local temperature. In systems that aggregate memory dies into packages, the temperature can be measured for the package or the memory dies in the packages, and the throttling can be at the package level or the memory die level. In this manner, even if the controller is hot, memory dies or packages that are not hot are not throttled and can maintain full performance.

FIG. 9 is a flow chart describing one embodiment of a process for intelligent temperature sensing and local throttling. In step 904, the system periodically monitors/senses system temperature using the system temperature sensor at or on controller 122. For example, step 904 can be performed by controller 122 using system temperature sensor 122e (see FIGS. 2 and 3) or another temperature sensor off of and near/adjacent controller 122. In step 906, controller 122 determines whether the measured system temperature from step 904 is greater than a first threshold. One example of a first threshold is 100 degrees Fahrenheit. However, other threshold temperatures can also be used. If the system temperature is not greater than the first threshold, than the process loops back to step 904. That is, no action is taken, and the system will continue to periodically monitor system temperature. The monitoring can be performed every second, every minute, every X seconds or every X minutes.

If the system temperature is greater than the first threshold (step 906), then in step 908 the system determines one or more memory temperature data values for each of the one or more memory packages using the one or more temperature sensors at the memory packages in response to determining that (and only if) the system temperature exceeds the first threshold. For example, controller 122 can access sensor readings from temperature sensors 260 in any of the memory packages and/or any of the temperature detection circuits 113 on any of the memory dies 108 (or another temperature sensor near a memory die). Each of these temperature sensors is connected to (or otherwise in communication with) controller 122 so that controller 122 can act on the information sensed. In one embodiment, a temperature data value can be a direct temperature reading, information for which temperature can be derived, or a mathematical function (or combination) of multiple temperature sensings. Thus, the temperature data values can be provided as one temperature data value per temperature sensor or a single temperature data value can represent information from multiple sensors. The temperature data values obtained in step 908 are representative or reflective of temperatures at the various memory packages and/or memory dies. As discussed above, the temperatures at the memory packages and/or memory dies are compared to a second threshold. In one embodiment, the second threshold is the same as the first threshold (e.g., 100 degrees). In another embodiment, the second threshold can be less than or more than the first threshold. The individual temperature readings from the individual memory packages (or memory dies) are used to locally throttle individual memory packages (or memory dies). That is, in step 910, the system will individually throttle performance of one or more memory packages (or memory dies) that have their temperature data values exceeding the second threshold. For example, controller 122 will cause those memory packages (or memory dies) that are at a temperature greater than the second threshold to lower their performance in order to lower temperature. In step 912, those memory packages (or memory dies) that have temperature data values that do not exceed the second threshold are not throttled.

In one embodiment, the throttling of performance in step 910 includes controller 122 (and/or other circuits of the one or more control circuits) individually throttling performance of individual memory packages (or memory dies) by reducing clock rates for the memory packages and/or memory dies being throttled. In another embodiment, the throttling includes controller 122 (or other of the one or more control circuits) reducing a quantity of instructions per unit of time sent to individual memory dies on a memory package being throttled.

Figure 10:
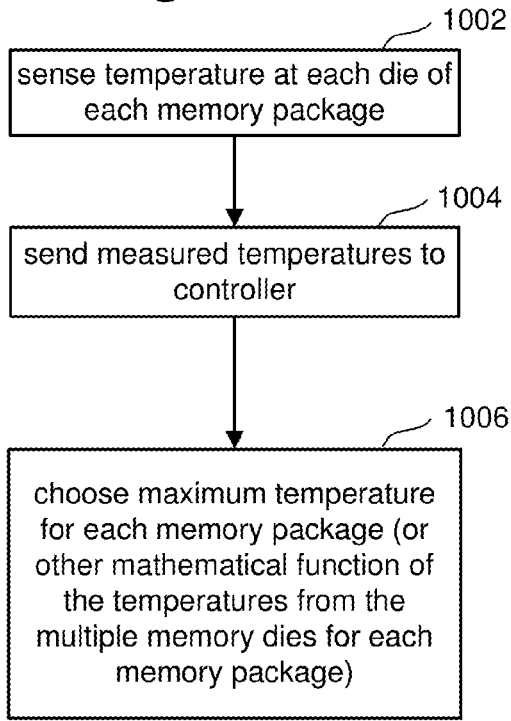
FIG. 10 is a flow chart describing one embodiment of a process for determining local temperature data values.

FIG. 10 is a flowchart describing one embodiment of a process for obtaining one or more memory temperature data values from memory packages. Thus, the process of FIG. 10 is one example implementation of step 908 for embodiments that include multiple memory packages that have multiple memory die on each memory package. In step 1002, the system senses temperature at each memory die 108 of each memory package. In one embodiment, this includes using temperature detection circuit/sensor 113 of each memory die 108. In step 1004, the temperature measurements are sent to controller 122. In one embodiment, steps 1002 and 1004 are performed at the direction of state machine 112. In step 1006, controller 122 chooses the maximum temperature for each memory package and assigns that maximum temperature to be the representative temperature for the memory package. Thus, that maximum temperature for each memory package is what will be compared to the second threshold discussed above. In another embodiment, rather than choosing a maximum temperature, a different mathematical function of the temperatures of the multiple memory dies can be used to select a representative temperature value. For example, controller 122 can use the average of the temperatures at each of the memory dies, the median value sensed, or a different mathematical function.

Figure 11:
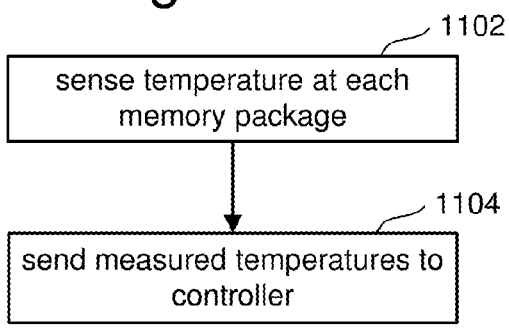
FIG. 11 is a flow chart describing one embodiment of a process for determining local temperature data values.

FIG. 11 is a flowchart describing another embodiment of obtaining one or more memory temperature data values. Therefore, FIG. 11 is another example implementation of step 908 of FIG. 9. In step 1102, the system sense temperature at each memory package. For example, the system performs a sensing operation using temperature sensor 260 for each memory package (see FIG. 3A). In another embodiment, the sensing of temperature in step 1102 can be performed by a temperature sensor adjacent but outside of the memory package, or using one or more temperature detection circuits/sensors 113 of one or more of the memory die 108 on the memory packages. In step 1104, the measured temperature information is sent to controller 122. Thus, each of the temperature sensors discussed above are connected to (or otherwise in communication with) controller 122.

Figure 12:
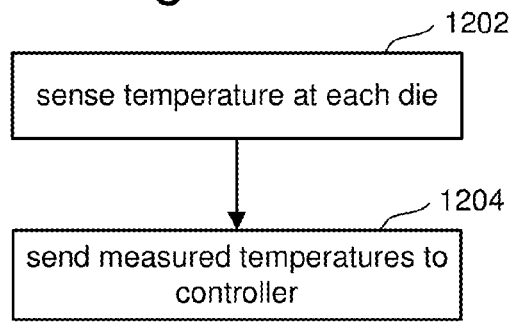
FIG. 12 is a flow chart describing one embodiment of a process for determining local temperature data values.

FIG. 12 is a flowchart describing another embodiment for determining one or more memory temperature data values. Therefore, FIG. 12 represents another example implementation of step 908 of FIG. 9. The process of FIG. 12 applies to an embodiment that does not have memory packages. Therefore, in step 1202, the system senses temperature at each memory die. For example, temperature detection circuit/sensor 113 will be used on each memory die to sense temperature information. In step 1204, that temperature information sensed in step 1202 is communicated to controller 122.

Figure 13:
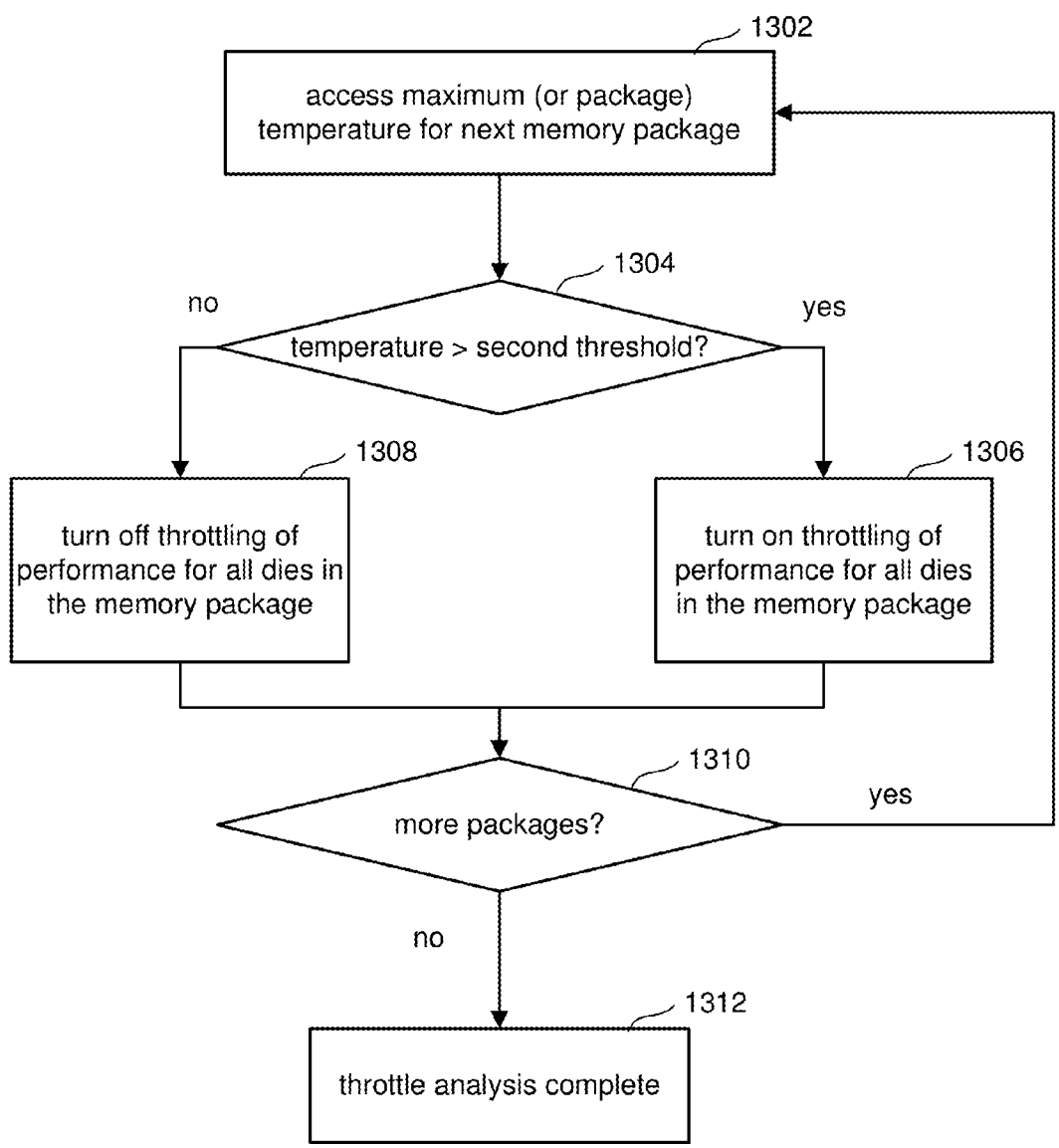
FIG. 13 is a flow chart describing one embodiment of a process for throttling memory performance.

FIG. 13 is a flowchart describing one embodiment for choosing to throttle or not throttle memory packages. Thus, the process of FIG. 13 is one example implementation of steps 910 and 912 for the embodiments of FIGS. 10 and 11. In one example, the process of FIG. 13 is performed by controller 122. In other examples, other components of the one or more of the control circuits discussed above can perform the process of FIG. 13. In step 1302 of FIG. 13, the system accesses the maximum temperature for the next memory package to be considered. If only one temperature was obtained for the memory package, then that one temperature (also known as the package temperature) will be accessed. In embodiments that use a different mathematical function to determine a representative temperature for a memory package, that representative temperature will be accessed in step 1302. In step 1304, the temperature accessed is compared to the second threshold. If the temperature is not greater than the second threshold, then throttling is turned off for that particular memory package in step 1308. In embodiments that have multiple dies and memory packages, throttling is turned off for all memory dies on the memory package. If the temperature accessed in step 1302 is greater than the second threshold (step 1304), then in step 1306 controller 122 turns on throttling of performance for all memory dies in the memory package. After steps 1306 or 1308, controller 122 determines whether there are more memory packages to consider in step 1310. If there are more packages to consider, then the process loops back to step 1302. Thus, the loop provided by steps 1302, 1304, 1306 and 1308 is performed for each memory package. After all memory packages have been considered (step 1310), then the throttle analysis is complete (step 1312).

Figure 14:
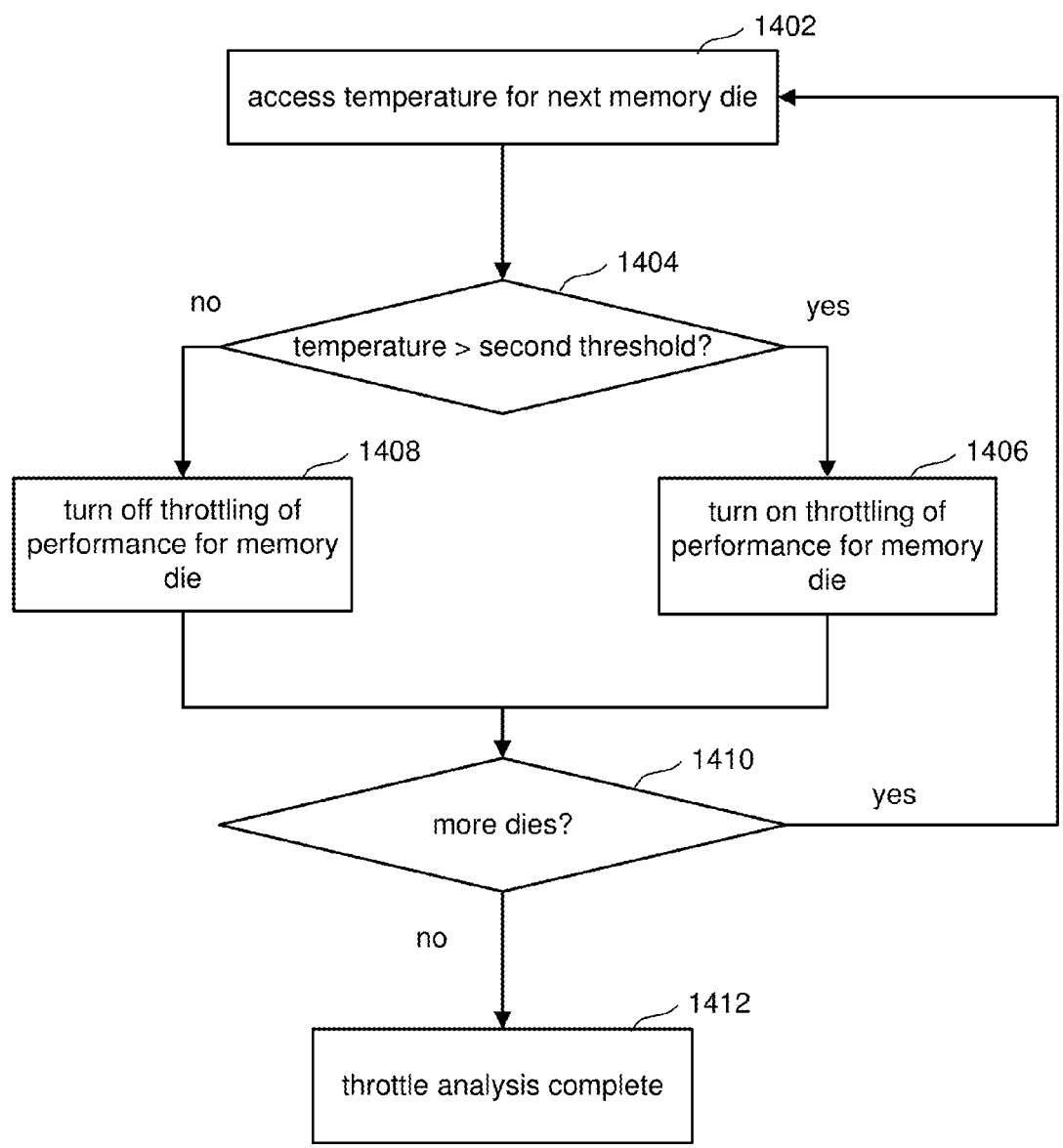
FIG. 14 is a flow chart describing one embodiment of a process for throttling memory performance.

FIG. 14 is a flowchart describing one embodiment for choosing to throttle or not throttle memory dies. That is, the process of FIG. 14 is another example implementation of steps 910 and 912. The process of FIG. 14 applies to the embodiment of FIG. 12, in which the system includes one or more memory dies that are not necessarily in a package. The process in FIG. 14 is performed by controller 122 (or another control circuit). In step 1402, controller 122 accesses a temperature for the memory die currently being considered. In step 1404, controller 122 determines whether the temperature accessed in step 1402 is greater than the second threshold. If so, controller 122 turn on throttling of performance for the memory die under consideration in step 1406. If the temperature is not greater than the second threshold, than controller 122 will turn off throttling of performance for the memory die under consideration. After steps 1406 and 1408, controller 122 determines whether there are more memory dies to consider. If so, the process loops back to step 1402; otherwise, the throttle analysis completes step 1412. As can be seen, steps 1402-1410 perform a loop, where the loop is performed once for each memory die.

In one embodiment, controller 122 includes a data structure that indicates whether the throttling is turned on or off for each memory die (or for each memory package). Therefore, when receiving instructions to program or read data from a host, controller 122 (e.g., throttle manager 239), can use that data structure to choose which one or more dies to send instructions to. As discussed above, those memory dies that are being throttled will receive less instruction per unit of time than memory dies not being throttled.

One embodiment includes a non-volatile storage apparatus, comprising: one or more control circuits; one or more memory packages connected to the one or more control circuits; a system temperature sensor connected to the one or more control circuits, the system temperature sensor is off of and at a distance from each of the one or more memory packages; and one or more memory temperature sensors connected to the one or more control circuits, each of the one or more memory temperature sensors positioned at one of the one or more memory packages. The one or more control circuits are configured to monitor system temperature using the system temperature sensor. The one or more control circuits are configured to determine one or more memory temperature data values for each of the one or more memory packages using the one or more memory temperature sensors in response to determining that the system temperature exceeds a first threshold. The one or more control circuits are configured to individually throttle performance of one or more of the memory packages that have their temperature data value exceeding a second threshold.

One embodiment includes a method for operating a non-volatile storage system, comprising: periodically monitoring temperature at a controller of the non-volatile storage system and determining whether the monitored temperature at the controller exceeds a first threshold; in response to determining that the monitored temperature at the controller exceeds the first threshold, sensing a temperature at a first memory die of the non-volatile storage system and determining whether the temperature sensed at the first memory die is greater than a second threshold; and in response to determining that the temperature sensed at the first memory die is greater than the second threshold, throttling performance of the memory die.

One embodiment includes a method for operating a non-volatile storage system, comprising: monitoring system temperature using a system sensor that is positioned off and at a distance away from one or more memory structures of the non-volatile storage system and determining whether the monitored system temperature exceeds a first threshold; in response to determining that the monitored system temperature exceeds the first threshold, sensing one or more memory temperatures using one or more sensors positioned at the one or more memory structures and determining whether the one or more memory temperatures exceeds a second threshold; and lowering performance of a particular memory structure of the one or more memory structures in response to determining that a particular temperature of the one or more temperatures sensed by a particular sensor of the one or more sensors that is positioned at the particular memory structure exceeds the second threshold.

One embodiment includes a non-volatile storage apparatus, comprising: one or more memory packages, each memory package comprises at least one monolithic three dimensional memory structure comprising a plurality of non-volatile memory cells; a system temperature sensor that is positioned off and at a distance away from the one or more memory packages; one or more memory temperature sensors, each of the one or more memory temperature sensors co-located at one of the one or more memory packages; means for monitoring temperature at the system temperature sensor and determining whether the monitored temperature at the system temperature sensor exceeds a first threshold; means for sensing temperature at the one or more memory temperature sensors in response to determining that the monitored temperature at the system temperature sensor exceeds the first threshold; and means for throttling performance of a particular memory structure that is co-located with at least one of the memory temperature sensors that has a sensed temperature greater than a second threshold.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
one or more control circuits;
one or more memory packages connected to the one or more control circuits;
a system temperature sensor connected to the one or more control circuits, the system temperature sensor is at a distance from each of the one or more memory packages; and
one or more memory temperature sensors connected to the one or more control circuits, each of the one or more memory temperature sensors positioned at one of the one or more memory packages;
the one or more control circuits are configured to monitor system temperature using the system temperature sensor, the one or more control circuits are configured to determine one or more memory temperature data values for each of the one or more memory packages using the one or more memory temperature sensors in reaction to determining that the system temperature exceeds a first threshold, the one or more control circuits are configured to individually throttle performance of one or more of the memory packages that have their temperature data value exceeding a second threshold.

2. The non-volatile storage apparatus of claim 1, wherein:
the one or more control circuits include a controller; the controller is physically separate from the one or more memory packages;
the system temperature sensor is positioned at the controller and configured to measure temperature at the controller; and
each of the one or more memory temperature sensors are positioned in and configured to measure temperature at one of the memory packages.

3. The non-volatile storage apparatus of claim 1, wherein:
the one or more memory packages comprises multiple memory packages that each have multiple memory dies;
each memory die includes at least one memory temperature sensor;
the one or more control circuits include a controller, the controller is implemented on a first die that is a separate die from any of the memory die; and
the system temperature sensor is positioned at the controller and configured to measure temperature at the controller.

4. The non-volatile storage apparatus of claim 1, wherein:
the one or more memory packages comprises multiple memory packages that each have multiple memory dies; and
the one or more control circuits are configured to individually throttle performance of one or more of the memory packages by throttling performance of all memory dies in the one or more of the memory packages.

5. The non-volatile storage apparatus of claim 1, wherein:
the one or more memory packages comprises multiple memory packages that each have multiple memory dies;
each memory die includes at least one memory temperature sensor; and
the one or more control circuits are configured to individually throttle performance of one or more of the memory packages by throttling performance of any memory die in the one or more of the memory packages that includes a memory temperature sensor that has sensed a memory temperature which exceeds the second threshold.

6. The non-volatile storage apparatus of claim 1, wherein:
the one or more control circuits are configured to individually throttle performance of one or more of the memory packages by reducing clock rate for a memory die in a memory package being throttled.

7. The non-volatile storage apparatus of claim 1, wherein:
the one or more control circuits are configured to individually throttle performance of one or more of the memory packages by reducing quantity of instructions per unit of time sent to a memory die in a memory package being throttled.

8. The non-volatile storage apparatus of claim 1, wherein:
the one or more memory packages each comprise multiple memory die; and
the temperature sensors are positioned on the memory dies.

9. The non-volatile storage apparatus of claim 1, wherein:
the one or more memory packages each comprise multiple memory die that each have a separate temperature sensor so that multiple memory temperature values are generated for each of the one or more memory packages; and the one or more control circuits are configured to throttle performance of an individual memory package of the one or more memory packages when a mathematical function of the multiple memory temperature values for the individual memory package exceeds the second threshold.

10. The non-volatile storage apparatus of claim 1, wherein:

the one or more memory packages each comprise multiple memory die;

each memory die includes at least one memory temperature sensor; and the one or more control circuits are configured to determine one or more memory temperature data values for each of the one or more memory packages by sensing temperature at each memory die of each memory package and identifying a maximum sensed temperature for each memory package.

11. The non-volatile storage apparatus of claim 1, wherein:

each of the one or more memory packages includes one or more monolithic three dimensional non-volatile memory structures;

the one or more control circuits are configured to determine whether the system temperature exceeds a first threshold;

the one or more control circuits include a controller; the controller is physically separate from the one or more memory packages;

the system temperature sensor is positioned at the controller and configured to measure temperature at the controller;

each of the one or more memory temperature sensors are positioned in and configured to measure temperature at one of the memory packages; and the controller, the one or more memory packages, the system temperature sensor and the one or more memory temperature sensors are part of a Solid State Drive.

12. A method for operating a non-volatile storage system, comprising:

periodically monitoring temperature at a controller of the non-volatile storage system and determining whether the monitored temperature at the controller exceeds a first threshold;

in reaction to determining that the monitored temperature at the controller exceeds the first threshold, sensing a temperature at a first memory die of the non-volatile storage system and determining whether the temperature sensed at the first memory die is greater than a second threshold; and in reaction to determining that the temperature sensed at the first memory die is greater than the second threshold, throttling performance of the memory die.

13. The method of claim 12, further comprising:

in reaction to determining that the monitored temperature at the controller exceeds the first threshold, sensing temperatures at multiple additional memory dies of the non-volatile storage system and determining whether the temperature sensed at the multiple additional memory dies are greater than the second threshold; and throttling performance of any of the multiple additional memory dies having a temperature greater than the second threshold.

14. The method of claim 12, wherein:

the sensing the temperature at the first memory die comprises sensing temperature at a first package, the first package includes the first memory die and multiple additional memory die; and the throttling performance of the memory die comprises the throttling performance of all memory dies of the first package.

15. A method for operating a non-volatile storage system, comprising:

monitoring system temperature using a system sensor that is positioned off and at a distance away from one or more memory structures of the non-volatile storage system and determining whether the monitored system temperature exceeds a first threshold;

in reaction to determining that the monitored system temperature exceeds the first threshold, sensing one or more memory temperatures using one or more sensors positioned at the one or more memory structures and determining whether the one or more memory temperatures exceeds a second threshold; and lowering performance of a particular memory structure of the one or more memory structures in response to determining that a particular temperature of the one or more temperatures sensed by a particular sensor of the one or more sensors that is positioned at the particular memory structure exceeds the second threshold.

16. The method of claim 15, wherein:

the monitoring system temperature comprises monitoring temperature of a controller; and the sensing one or more memory temperatures using one or more sensors positioned at the one or more memory structures comprises sensing temperatures of multiple memory dies in multiple packages.

17. The method of claim 15, wherein:

the sensing one or more memory temperatures using one or more sensors positioned at the one or more memory structures comprises sensing temperatures of multiple memory dies in multiple packages, determining a maximum temperature for each package and determining if the maximum temperatures exceed the second threshold; and lowering performance of a particular memory structure comprises lowering performance of all memory dies in a package having a maximum temperature that exceeds the second threshold.

18. The method of claim 15, wherein:

the sensing one or more memory temperatures using one or more sensors positioned at the one or more memory structures is only performed if the monitored system temperature exceeds the first threshold.

19. The method of claim 15, further comprising:

determining that the monitored system temperature exceeds the first threshold at a first time;

determining that the monitored system temperature does not exceed the first threshold at a second time; and in reaction to determining that the monitored system temperature does not exceed the first threshold, operating without the sensing one or more memory temperatures using one or more sensors positioned at the one or more memory structures and determining whether the one or more memory temperatures exceeds a second threshold.

20. A non-volatile storage apparatus, comprising:
one or more memory packages, each memory package comprises at least one monolithic three dimensional memory structure comprising a plurality of non-volatile memory cells;
a system temperature sensor that is positioned off and at a distance away from the one or more memory packages;
one or more memory temperature sensors, each of the one or more memory temperature sensors co-located at one of the one or more memory packages;
means for monitoring temperature at the system temperature sensor and determining whether the monitored temperature at the system temperature sensor exceeds a first threshold;
means for sensing temperature at the one or more memory temperature sensors only if it is determined that the monitored temperature at the system temperature sensor exceeds the first threshold; and
means for throttling performance of a particular memory structure that is co-located with at least one of the memory temperature sensors that has a sensed temperature greater than a second threshold.

* * * * *